(12) United States Patent
Schmitt

(10) Patent No.: US 9,304,180 B2
(45) Date of Patent: Apr. 5, 2016

(54) MR-ANGIOGRAPHY WITH NON-CARTESIAN SIGNAL ACQUISITION

(75) Inventor: Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/537,376

(22) Filed: Jun. 29, 2012

(65) Prior Publication Data

US 2013/0006098 A1 Jan. 3, 2013

(30) Foreign Application Priority Data

Jun. 29, 2011 (DE) .......................... 10 2011 078 273

(51) Int. Cl.
*A61B 5/026* (2006.01)
*G01R 33/563* (2006.01)
*G01R 33/48* (2006.01)

(52) U.S. Cl.
CPC ........ *G01R 33/5635* (2013.01); *G01R 33/4824* (2013.01)

(58) Field of Classification Search
CPC ............. A61B 5/0263; G01R 33/4824; G01R 33/4818; G01R 33/5635; G01R 33/56366
USPC .......................................................... 600/419
See application file for complete search history.

(56) References Cited

U.S. PATENT DOCUMENTS

| | | | |
|---|---|---|---|
| 5,588,431 A * | 12/1996 | Mani et al. ...................... | 600/410 |
| 6,233,475 B1 * | 5/2001 | Kim et al. ....................... | 600/420 |
| 6,487,435 B2 | 11/2002 | Mistretta et al. | |
| 6,630,828 B1 | 10/2003 | Mistretta et al. | |
| 2004/0068175 A1 * | 4/2004 | Miyazaki et al. .............. | 600/410 |
| 2004/0207401 A1 * | 10/2004 | Kirsch ............................ | 324/306 |
| 2008/0205735 A1 * | 8/2008 | Nielles-Vallespin et al. . | 382/131 |
| 2009/0088626 A1 * | 4/2009 | Sutton et al. ................... | 600/419 |
| 2010/0226556 A1 * | 9/2010 | Kumai et al. .................. | 382/131 |
| 2011/0071382 A1 | 3/2011 | Miyazaki et al. | |
| 2011/0140697 A1 * | 6/2011 | Shinoda et al. ............... | 324/309 |

FOREIGN PATENT DOCUMENTS

WO          WO99/30179          6/1999

OTHER PUBLICATIONS

Madhuranthakam et al., Undersampled Elliptical Centric View-Order for Improved Spatial Resolution in Contrast-Enhanced MR Angiography, Magnetic Resonance in Medicine 55:50-58, 2006.*
Seiberlich et al., Parameter-Free Reconstruction of Highly Undersampled MR Angiography Images using Gradient Descent with Sparsification, ISMRM 2010, Abstract, No. 4873, May 2010.*

(Continued)

*Primary Examiner* — Bo J Peng
(74) *Attorney, Agent, or Firm* — Schiff Hardin LLP

(57) ABSTRACT

In a method and apparatus for the creation of an MR image of a vascular structure of an examination region, the spins in the examination region are saturated by the irradiation of at least one RF saturation signal, which delivers a lower signal intensity as spins in a subsequent MR signal recording for the creation of the MR angiographic image, which flow through at least one blood vessel into the examination region, and are not saturated by the RF saturation pulse. Raw data space of the MR angiographic image is read out with a non-Cartesian trajectory in the MR signal acquisition for the creation of the MR angiographic image.

10 Claims, 5 Drawing Sheets

(56) References Cited

OTHER PUBLICATIONS

Haider et al., 3D High Temporal and Spatial Resolution Contrast-Enhanced MR Angiography of the Whole Brain, Magn Reson Med. Sep. 2008 ; 60(3): 749-760.*

Mostardi et al., Controlled Experimental Study Depicting Moving Objects in View-Shared Time-Resolved 3D MRA, Magn Reson Med. 2009, July, 62, 1, 85-95.*

Seiberlich et al: "Parameter-Free Reconstruction of Highly Undersampled MR Angiography Images using Gradient Descent with Sparsification", ISMRM (2010).

Jeong et al: "Accelerating Time-Resolved MRA With Multiecho Acquisition", Magnetic Resonance in Medicine vol. 63: (2010) pp. 1520-1528.

Wu et al: "3D Angiography with Psuedo Continous Arterial Spin Labeling(PCASL) and Accelerated 3D Radial Acquisition", Proc. Intl. Soc. Mag. Reson. Med. vol. 19 (2011).

çukur et al: "Non-contrast-Enhanced Flow-Independent Peripheral MR Angiography with Balanced SSFP", Magnetic Resonance in Medicine vol. 61 (2009) pp. 15343-1539.

Katoh et al: "Spin-labeling Coronary MR Angiography with Steady-State Free Precession and Radial k-Space Sampling:Initial Results in Healthy Volunteers", Radiology, vol. 236, (2005) pp. 1047-1052.

Scheffler et al: "Reduced Circular Field-of-View Imaging", Magnetic Resonance Medicine, vol. 40 (1998) pp. 474-480.

Lustig et al: "Sparse MRI: The Application of Compressed Sensing for Rapid MR Imaging", Magnetic Resonance in Medicine vol. 58, (2007) pp. 1182-1195.

Seiberlich et al: "Using the GRAPPA Operator and the Generalized Sampling Theorem to Reconstruct Undersampled Non-Cartesian Data", Magnetic Resonance in Medinine vol. 61, (2009) pp. 705-715.

Zhang et al: "Magnetic Resonance Imaging in Real Time: Advances Using Radial FLASH", Journal of Magnetic Resonance Imaging vol. 31, (2010) pp. 101-109.

Edelman et al: "Quiescent-Interval Single-Shot Unenhanced Magnetic Resonance Angiography of Peripheral Vascular Disease: Technical Considerations and Clinical Feasibility", Magnetic Resonance in Medicine vol. 63, (2010) pp. 951-958.

Uecker et al: "Nonlinear Inverse Reconstruction for Real-Time MRI of the Human Heart Using Undersampled Radial Flash", Magnetic Resonance in Medicine vol. 63, (2010) pp. 1456-1462.

Wyttenbach et al: "Renal artery assessment with nonenhanced steady-state free precession versus contrast-enhanced MR angiography", Radiology 2007; vol. 245(1) (2007) pp. 186-195.

* cited by examiner

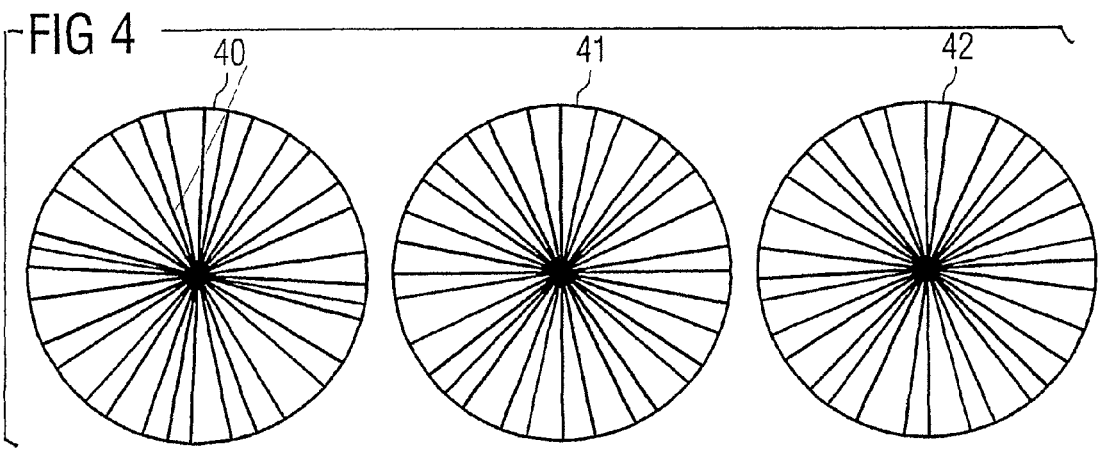
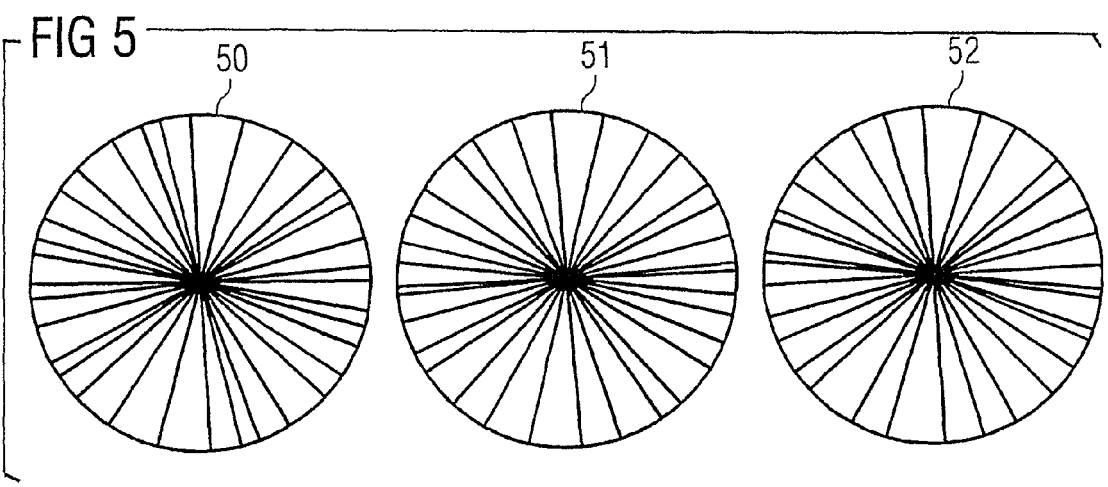

MR-ANGIOGRAPHY WITH NON-CARTESIAN SIGNAL ACQUISITION

BACKGROUND OF THE INVENTION

1. Field of the Invention

The present invention concerns a method for the generation of an MR image of a vascular structure of an examination region, and an MR apparatus for this purpose. In the following, the term "angiography image" shall be used in the generic sense; it does not necessarily encompass only a single two-dimensional image, but depending on the context, may also encompass an angiographic image data set of a desired volume.

2. Description of the Prior Art

In the field of MR angiography, methods that function without the need for contrast agents are gaining significance. One class of such methods exploits the pulsatile nature of the arterial blood flow. With signal recording (data acquisition) of a flow-sensitive sequence at the point in time of the quicker flow rate (systole), one obtains, in the ideal case, a deletion (absence) of the arterial signal. With a signal recording at the point in time in the cardiac cycle at which point the rate is at a minimum, or zero (diastole), one obtains the arteries ideally with a bright signal. Through the subtraction of the two recorded data sets, the signal of the stationary tissue can be removed, so an arterial angiography is obtained. While very good results have been obtained with this method in healthy subjects, the results for other patients leaves something to be desired. Particularly with the presence of pathologies, the pulsatile dynamics may be only very weakly pronounced, or even at a complete standstill, such that only a limited difference, or none at all, occurs between the blood flow rate during systole and the blood flow rate in diastole.

Another class of such methods uses a marking of the examination region in question for suppressing the statistic tissue signal (so-called spin labeling). During a waiting period $t_{in}$, fresh unmarked blood can flow in from externally, and this blood is brightly depicted by means of the following signal acquisition. Generally, an additional measure for suppression is provided, for example by means of the upstream activation of a fat saturation module. Usually it is also advantageous to configure the measurement to the heartbeat and thereby to the flow characteristic, i.e. to place the marking temporally prior to the systolic pulse wave, and to locate the waiting period during the pulse wave, and the signal recording directly after the pulse wave. The marking, or the so-called labeling, can be implemented, for example, as layer-selective saturation or inversion, and conventionally, the imaging sequence is implemented as a three-dimensional procedure. A method of this type is described, for example, by Wyttenbach et al. (Renal artery assessment with non-enhanced steady-state free precession versus contrast-enhanced MR angiography. Radiology 2007; 245(1): 186-195). A fundamental problem with this method is that the vessels of the volume in question must be filled during $t_{in}$ with fresh blood, flowing in from outside of the marked volume. Therefore, 3D methods with larger marked volumes are more suited for regions with very fast or wider-reaching blood flows, e.g. in the head, the aorta or the kidney arteries. In the peripheral regions of the body the blood remains still during the major portion of the cardiac cycle, and is then quickly pushed forward during the pulse wave. Even with healthy persons, the distance traveled amounts to only a few centimeters, such that in the legs, hardly any long visual field can be used extending in the direction of the legs, designated herein as the z-axis. This limitation is more striking with patients whose pulsatile dynamics are less pronounced, wherein the distance traveled by the blood during the remaining weak pulse wave may be significantly shorter.

In Edelman et al., in Magn Reson Med 63:951-958 (2010), with the title, "Quiescent-Interval Single-Shot Unenhanced Magnetic Resonance Angiography of Peripheral Vascular Disease: Technical Considerations and Clinical Feasibility," the use of a 2D method is described, in which the blood must only be transported by the pulse wave over the thickness of a two-dimensional layer, which is reliably fulfilled even with unhealthy patients. A single axial layer is thereby recorded with each heartbeat. Typically, layer thicknesses of 3 mm and 1.4 mm are used. To create thinner thicknesses, an extension of the RF pulse, and thus the repetition periods TR, is required, which is undesired. Furthermore, with even thinner layers, the obtainable signal-to-noise ratio is marginally low, in particular with the clinically, currently most commonly used, field strengths of 1.5 tesla. This spatial resolution, limited in the z-axis, represents a major limitation of the method, in particular when finer vessels do not run strictly along the z-axis, as is the case, for example, in regions of the trifurcation in the lower leg, or with pathologies.

Another (as yet not used) alternative could be a three-dimensional imaging with very thin partitions. A problem with this alternative would be that efficiency would not be increased because the time for encoding a 3D partition is the same as that for the acquisition of a 2D layer. To improve the resolution on the z-axis from, for example, 3 mm to 0.75 mm, the measuring time must be increased by a factor of 4 accordingly. This is a problem, because, for example, with an angiography of the pelvis-leg region, normally a coverage from the feet up to the abdominal region is desired.

SUMMARY OF THE INVENTION

It is an object of the present invention to provide an angiography method that enables a good spatial resolution along all three spatial axes, without significantly lengthening the measuring time period.

The above object is achieved in accordance with the invention by a method for the creation of an MR angiographic image of a vascular structure in an examination region, in which the spins in the examination region are saturated by the radiation of at least one RF saturation pulse, which delivers a lower signal intensity as spins in a subsequent MR signal acquisition for the creation of the MR angiographic image, which flow through at least one blood vessel into the examination region, and which are not saturated by the (at least one) RF saturation pulse. According to the invention, raw data space (k-space) of the MR angiographic image is read out with a non-Cartesian trajectory during the MR signal acquisition for the creation of the MR angiographic image.

The at least one RF saturation pulse has the purpose of preparing the spins in the examination region in such a manner that at the point in time in which the MR signal is recorded, they are suppressed for the most part. A conventional saturation module, composed of one or more 90° pulses, may be used, but this is not necessary. Because there is a waiting period between the RF saturation and the data recording, it may be advantageous to execute the saturation pulse in a different manner, e.g. in the form of an inversion pulse, which at first does not saturate the magnetization, but rather inverts the magnetization, i.e. shifts it 180° in the opposite direction. Without limiting the generality, the term "saturation" is used in general in the following.

By the saturation of the spins in the examination region, so-called spin labeling, a good signal-background suppression and thereby a substantially pure depiction of the vessels is normally enabled. The resulting image data have a limited information density spatially, the so-called "sparsity." With data having very little spatial information density, it is possible to obtain an enormous under-sampling of raw data space (k-space). This under-sampling of the k-space can be readily accomplished with non-Cartesian trajectories in k-space. It is possible to record only a few points in raw data space in order to obtain that a good spatial resolution in the third dimension, i.e. in the main direction of flow, within an acceptable time frame.

One possibility for establishing the non-Cartesian trajectories is the determination of the blood in the examination region in a direction orthogonal to the main direction of flow, with the trajectory being a radial trajectory having numerous spokes through the center of raw data space. If the main flow direction of the blood is defined as the z-axis, without limitation to generality, then it is advantageous to set the radial trajectories in raw data space perpendicular to the main flow direction, i.e. in the kx and ky axes. In the two-dimensional case, the center of the rotational space is a point, and in the three-dimensional case, it is an axis parallel to the main flow direction.

Individual spokes of the radial trajectory can be designed, for example, such that a plane is produced in raw data space at a right angle to the main flow direction, with the spokes irregularly distributed in this plane such that, at a right angle to the flow of blood, an elliptical or oval field of view is obtained in the MR angiographic image, instead of a circular field of view. As a result of the irregular density of the radial spokes, an elliptical or oval field of view can be obtained in the image space, which enables an optimized adjustment of the signal recording to the object that is to be depicted. This is the case, above all, in the leg and abdominal region, where approx. 35-45 cm is to be covered in the left-right direction, while in the anterior-posterior direction, only 15-25 cm needs to be covered.

Preferably, prior to the signal recording for the creation of the MR angiographic image, a sequence module is executed for suppressing the fat signal during the signal recording. To the greatest extent possible, only the image points of the blood vessels should generate bright image points in the MR angiography. The fat signal also produces bright image points during the imaging. Through the suppression of the fat signal, it is possible to suppress high signal portions of potential fatty tissues in the MR angiographic image and to limit the bright signal points to the vessels.

With the signal recording for creating the MR angiographic image, a sequence based on a gradient echo may be used. The MR angiography sequence may be a normal gradient echo sequence or a so-called TrueFISP sequence, in which all gradients in all spatial planes are re-focused. It is, however, also possible to execute the data acquisition by means of a fast spin echo sequence, in which numerous signal echoes are read out after each RF excitation pulse. In addition, TrueFISP sequences should—even though certain parallels to spin-echo or turbo-spin-echo sequences are discussed in a scientific context—according to the definition, be included in the family of gradient echo sequences.

In using a gradient echo sequence, it is possible to use two different repetition periods as the repetition time between two RF excitation pulses, used in an alternating sequence, i.e. the use of a first repetition period TR1 and subsequently a second repetition period TR2 and subsequently the repetition period TR1 again, etc. With a selection of the repetition period TR of this type, it is also possible to depict the fat signal as dark, due to the frequency dependency of the signal in the MR angiographic image. The use of these alternating repetition periods TR is described in greater detail in Cukur et al. in Magn Reson Med 61:1533-1539 (2009).

Moreover, it is possible to use a repetitive reconstruction process for the image reconstruction of the MR angiographic image taken from the non-Cartesian trajectory in raw data space. In this case, it may be advantageous to begin the iteration with a good approximation of the image. In the context of the reconstruction of a series of numerous temporal phases, the approach is presented in Seiberlich et al., ISMRM 2010, Abstract, No. 4873, in which, after the signal recording of a reconstructed MR angiographic image of one phase, it is used as the starting point of the temporally subsequent phase for the repetitive reconstruction of the temporally subsequent MR image. For this purpose, an adjacent temporal phase is used as the starting point for the first approximation for the iteration, due to the fact that phases that are occurring in a relatively close temporal proximity differ only in small details.

In another embodiment, this principle can also be applied to the spatial dimension because particularly with peripheral angiographic images, there is usually only a slight difference from one layer to the next in the head-to-foot direction. A comparison of the image obtained thereby with the measurement data, and therefore a convergence in the direction of the real image, takes place over the course of numerous iterations. In this embodiment, numerous neighboring examination regions are thus recorded in the phase series, and a previously reconstructed MR angiographic image of a spatially adjacent examination region is used as the iterative reconstruction starting point for the iterative reconstruction of an MR angiographic image of an examination region.

One possibility for covering the desired volume for the MR angiography is to use numerous 2D recordings, i.e. to examine the examination region in numerous layer planes having a predetermined thickness, with the layer planes being substantially perpendicular to the main flow direction of the blood. In this manner it is ensured that the blood flowing into the layer plane delivers a high signal portion and is not saturated by the previous saturation pulse in the layer itself. These neighboring layer planes can be adjacent to one another, but an overlapping of neighboring layers is also equally possible.

Through the use of spokes running radially through the center of raw data space, the spokes from neighboring layer planes may be selected such that with neighboring layer planes, different raw data points can be recorded, aside from center of raw data space. This means that if the spokes of two neighboring layer are superimposed on one another, these spokes will not lie on top of one another, but rather are rotated at an angle against one another. Among other things, this is advantageous if the image reconstruction is carried out according to the so-called view-sharing technology, in which raw data points from two different neighboring layer planes are used for the creation of an MR angiographic image, in order to reconstruct, for example, a single MR image.

In another variation, the recording of individual spokes can be selected such that during the data acquisition, i.e. from one spoke to another, the position of the excitation layer constantly changes. In this manner, it is possible to retrospectively use a specific number of spokes in order to reconstruct an image of a corresponding entire layer. In a particular execution, the spokes can be configured according to the so-called "golden angle," with which a substantially even distribution is obtained, when one singles out an arbitrary number of spokes.

Furthermore it is possible to select the spokes in raw data space unevenly or incoherently, or even randomly. With a randomized or pseudo-randomized configuration of the individual spokes of this type, certain boundary conditions may be used, such as, for example, the aforementioned condition that the frequency of the spokes is unevenly distributed in the plane, and therefore is a function of the direction in this plane.

It is furthermore possible to record the examination region that is to be covered as a three-dimensional examination volume, in which, with the MR signal recording for the creation of the MR angiographic image, an additional phase encoding gradient is used for the encoding in the third spatial axis, which lies substantially parallel to the main flow direction of the blood in the examination volume. It is understood that with so-called 2D procedures as well, a three-dimensional examination volume is covered, although one speaks, as is typical in MR technology, of 2D procedures, when numerous layer are sequentially recorded, and of 3D procedures when an additional encoding gradient is used in the third spatial axis for the resolution of the volume along the third spatial axis.

In one embodiment, raw data space of the three-dimensional examination volume can be cylindrically designed, wherein the additional phase encoding gradient lies in the main flow direction of the blood in the examination volume, and partitions the cylindrically shaped examination volume along the main flow direction of the blood as a partition encoding gradient. Raw data space is then read radially in spokes perpendicular to the main flow direction of the blood in individual partitions. This trajectory, known by the name "Stack of Stars," can also be combined, for example, with the uneven spoke density for generating an elliptical or oval field of view. In addition, the spokes in neighboring partitions may be turned toward each other, as is already done in the two-dimensional case, such that with neighboring partitions, different raw data points are recorded, aside from the center of raw data space.

In another embodiment, it is possible to allow the density of the spokes to decrease in the individual partitions from the center of the cylindrically shaped raw data space towards the edge along the plane of the partition. With this embodiment, the density, or number of spokes in the three-dimensional cylindrical k-space decreases with the increasing spacing of the partition encoding plane from the plane kz=0, wherein the z-axis in turn is the main flow direction, without limiting the generality, and the individual partitions are perpendicular to said z-axis.

The invention furthermore concerns a magnetic resonance apparatus for creating the MR angiographic image, having a RF control unit for emitting the RF pulses, in particular the RF saturation pulses, through which the spins in the examination region are saturated, which then have a lower signal intensity in the subsequent signal recording than the spins, which flow over the blood vessel into the examination region. Furthermore, a gradient control unit for controlling the magnetic field gradients is present, which is necessary for the spatial encoding of the spins and for generating the MR images. An imaging sequence control unit controls the RF control unit and the gradient control unit, and controls the MR signal recording, wherein the control unit reads out raw data space with a non-Cartesian trajectory.

Preferably the imaging sequence control unit functions as described in greater detail above, with an appropriate selection of the reading of raw data space.

BRIEF DESCRIPTION OF THE DRAWINGS

FIG. 4 shows scanning patterns for a circular field of view with a randomized distribution of the spokes in neighboring layers.

FIG. 5 shows scanning patterns for generating an elliptical field of view and an uneven distribution of the spokes.

DESCRIPTION OF THE PREFERRED EMBODIMENTS

Figure 1:
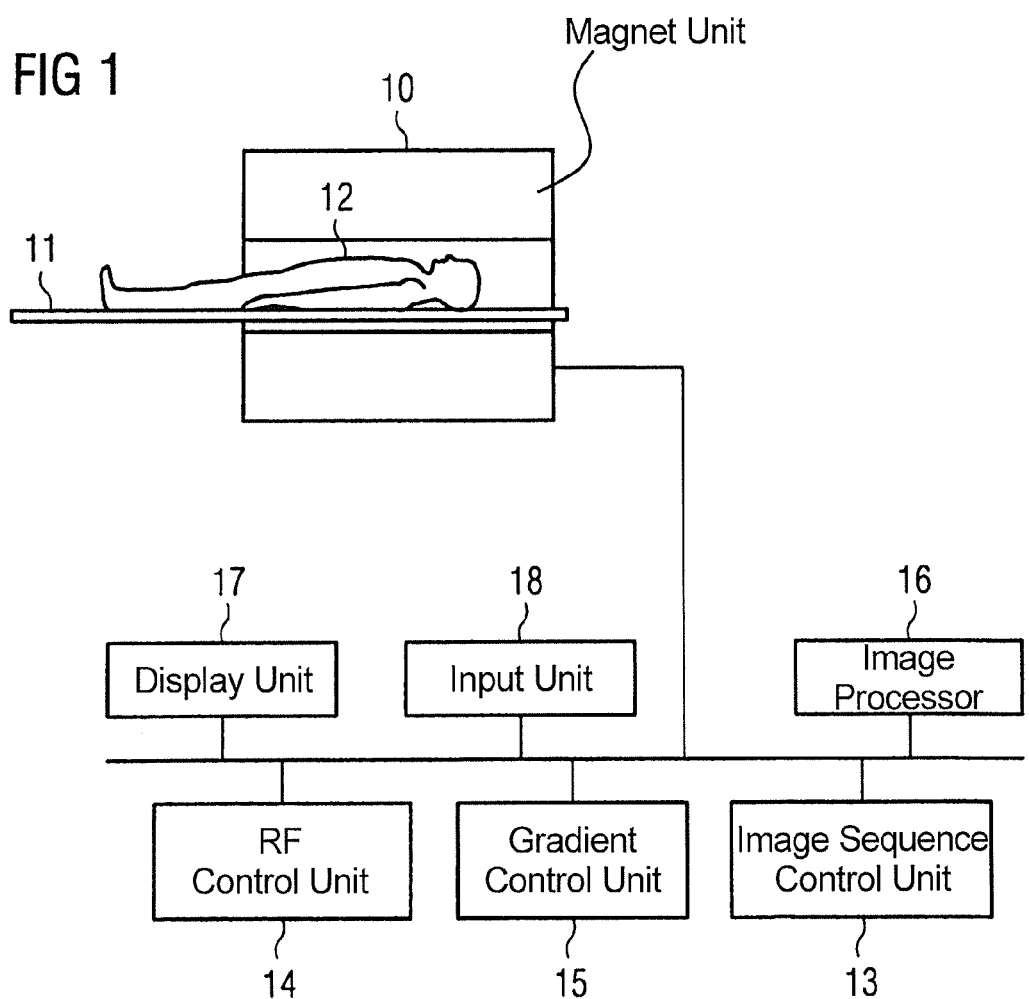
FIG. 1 schematically illustrates an MR apparatus for generating an MR angiographic image according to the invention.

An MR apparatus is depicted schematically in FIG. 1, with which an MR angiographic image having a good spatial resolution in all three spatial planes can be created in an acceptable measurement time period. The MR apparatus has a magnet 10 for generating a polarization field BO. An examination subject 12 placed on a bed 11 is moved into the magnet 10. The magnetization present in the examination subject can be tipped out of equilibrium by irradiating the patient with radio-frequency pulses. The relaxation processes occurring after the irradiation with RF pulses can be detected by coils, not shown in FIG. 1. For the spatial encoding of the detected signals, magnetic field gradients are superimposed on the basic magnetic field by gradient coils (not shown) in order to obtain a spatial connection of the detected signals. The method in general, with which MR images can be generated by means of a sequence of emitted RF pulses, and the activation of magnetic field gradients, is known to those skilled in the art, and need not be explained in greater detail.

The MR apparatus also has an imaging sequence control unit 13 that, depending on the selected imaging sequence, controls the irradiation of the RE pulses and the activation of the magnetic field gradients, as well as the signal readout. An RF control unit 14 is provided to control the RF pulses, which receives information from the imaging sequence control unit 13 for the temporal sequence in which the RF pulses are to be emitted. A gradient control unit 15, which is also controlled by the imaging sequence control unit 13, is responsible for the activation of the individual magnetic field gradients. The detected signals are converted in an image processor 16 into MR images, which can then be displayed on a display unit 17. The activity of the MR apparatus can be controlled by means of an input unit 18 by a technician, who can select the imaging sequences, or the layer planes or examination volume, respectively, from which the MR images are to be generated.

Figure 2:
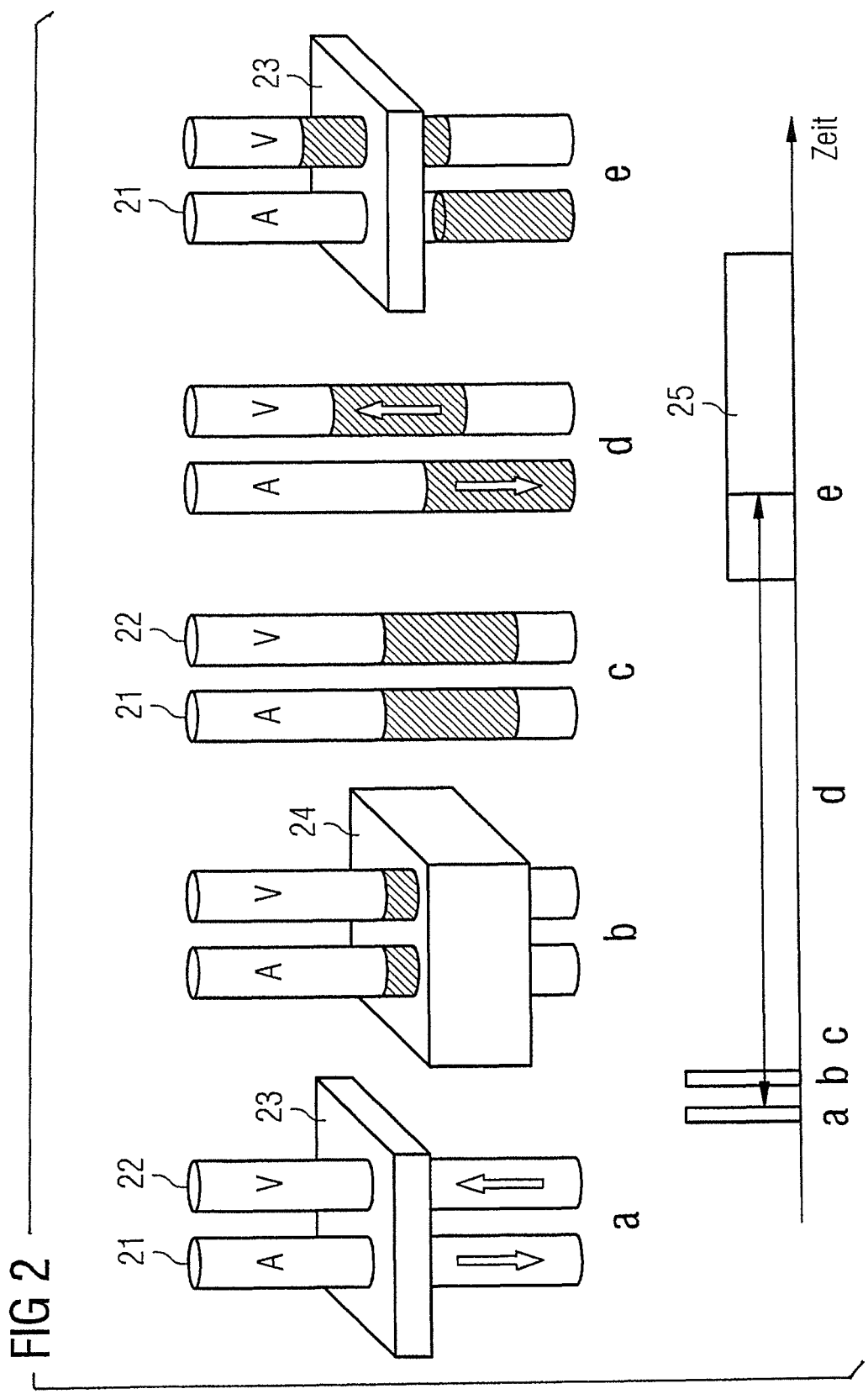
FIG. 2 shows the time sequence of an MR angiographic measurement with the formation of saturated layers.

Together with FIG. 2, the fundamental temporal activity of an imaging sequence is shown, with which depictions of the blood vessels are possible by means of the saturation of the spins in the layer in question. In FIG. 2, an artery 21 and a vein 22 are depicted in an exemplary manner, wherein the blood flow in the artery and the vein is in opposite directions, as indicated by the arrow in the left image. In the upper section of FIG. 2, the saturation of the spins, and the transportation of the saturated spins at various points in time a-e of the imaging sequence, is shown, wherein the points in time a-e are given at the bottom of FIG. 2 in the temporal sequence. At point a the spins are saturated in the image plane 23, from which the MR angiographic image is to be created. This can result, for example, from a 90° saturation pulse. In order to cause the venous spins, which in FIG. 2, flow from below into the layer 23, to make signal contribution in the signal recording, another saturation volume 24 is selected, in which the spins are saturated by a 90° pulse, for example. At point c, immediately after saturation of the planes or volumes 23 and 24, respectively, the grey highlighted region is saturated in the arteries 21 or veins 22, respectively. The saturated spins in the arteries or veins continue to flow by means of the blood flow in the arteries and veins, as can be seen in image d. During the signal readout in the selection window 25, at point e, for example, the venous spins have no portion of the overall signal because the saturated spins in the image plane 23 flow therein. Likewise, the stationary spins in the layer 23 have very little of the signal contribution during the signal recording, as this is also saturated by the saturation pulse at point a. The greatest signal contribution is therefore from the fresh spins flowing through the arteries in plane 23.

In addition, a triggering of the signal acquisition to the phase of the fast blood flow may take place, i.e. the signal acquisition is EKG triggered or, for example, pulse triggered. The temporal position of the pre-preparation at points a and b can be selected, for example, such that is takes place shortly before the cardiac phase, in which the blood flow flows into the plane or volume, respectively, to be measured. The saturations at the points a and b can be either a layer selective saturation with a 90° pulse or a layer selective inversion with a 180° pulse.

Moreover, in addition to the two saturation pulses at the points a and b, a module for suppressing the fat signal can be executed. The fat signal suppression serves additionally to suppress bright signal portions outside of the arteries 21.

A gradient echo sequence or a gradient echo sequence with completely refocused gradients in all spatial axes may be used as the actual imaging sequence, a so-called TrueFISP sequence. The signal recording can also be carried out with variables, i.e. excitation flip angles continuously changing over the course of the recording time. In the case of a TrueFISP sequence, alternating repetition times can also be used in order to suppress the fat signal.

Instead of a gradient echo-based signal generation, a fast spin echo imaging sequence can also be used. Both with the gradient echo based signal recording as well as with the spin echo-based signal recording, the data acquisition takes place such that raw data space or k-space is not Cartesian.

Figure 3:
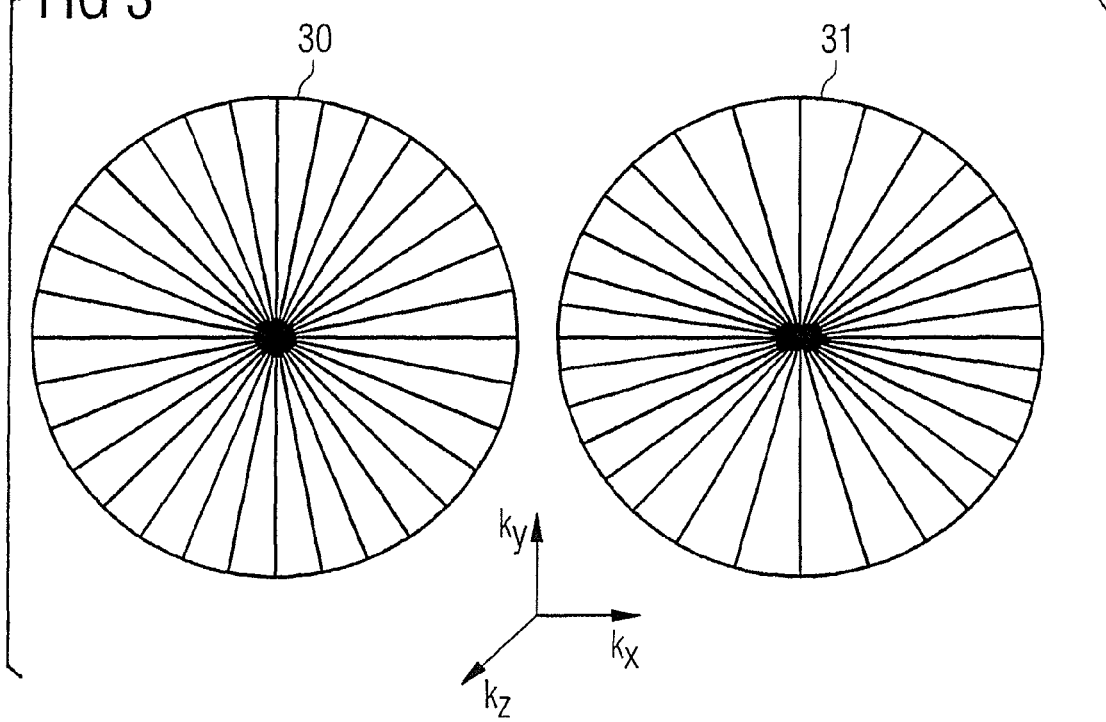
FIG. 3 illustrates a scanning pattern for a circular or elliptical field of view having an even or uneven distribution of the spokes.

An exemplary non-Cartesian data recording is shown in FIG. 3. In the left hand part of FIG. 3 a scanning pattern 30 for a circular field of view is depicted, wherein spokes running through the k-space center are recorded. The individual spokes are perpendicular to the blood flow direction of FIG. 2 for this, i.e. the main flow direction flows either into the active plane or out of the active plane. A scanning pattern 31 is depicted in the right hand image of FIG. 3, which results in an elliptical field of view in the image space, i.e. in the MR image. With the scanning pattern depicted in the right image, the individual spokes are distributed evenly, unlike the depiction in the left image, but instead there is a greater density in the region of 9 o'clock, or 3 o'clock, respectively, and a lower density at 12 o'clock and 6 o'clock, if a clock face is used as the fundamental orientation indication. The scanning pattern shown in the right hand example of FIG. 3 is optimized, for example, for the creation of a leg or abdominal angiography, in which one requires a greater right-left expansion than an upper-lower expansion.

The desired imaging region of the entire leg up to the abdomen can be scanned over numerous 2D layers having a certain thickness, wherein the scanning, with one of the scanning patterns shown therein, is radial within the 2D layer, as depicted in FIG. 3.

In FIG. 4 it is shown how the scanning pattern of neighboring planes can be distributed. It is schematically depicted in FIG. 4 that the scanning pattern 40 for a first layer differs from a scanning pattern 41 of a second layer, in that by superimposing the two scanning patterns 40 and 41, aside from the k-space center, none of the same k-space points are scanned. This also applies to the scanning pattern 42, such that preferably, none of the spokes in the scanning patterns 40-42 correspond to another spoke in the patterns. The selection of the individual spokes can be random, wherein the distribution is distributed substantially evenly over the scope of the distribution.

Figure 6:
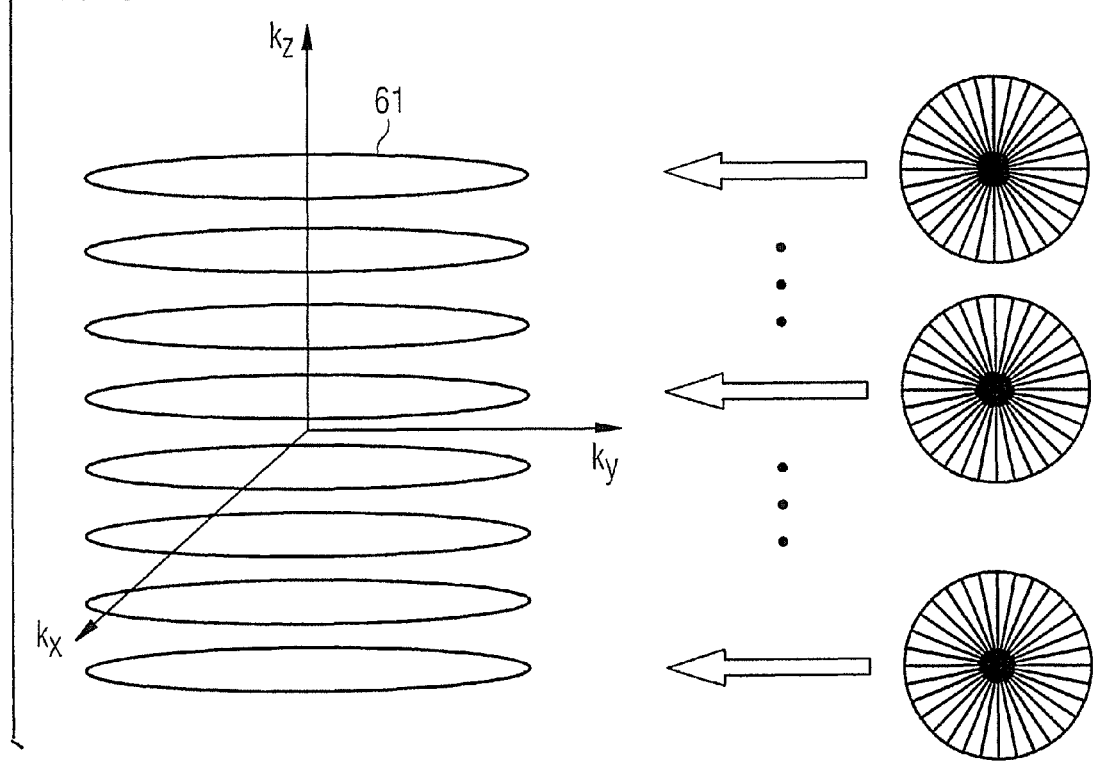
FIG. 6 shows, in an exemplary manner, a three-dimensional cylindrical scanning pattern with eight partitioning encoding planes or steps in the main flow direction.

The imaging sequence can also be a three-dimensional imaging sequence, wherein a three-dimensional examination volume is read out after excitation of this volume, through use of an additional partition encoding gradient in the third spatial axis, as is schematically depicted, for example, in FIG. 6. The three-dimensional k-space is cylindrically scanned in this case, with eight partition encoded planes 61, or eight encoding steps in the third spatial axis, defined here as the z-axis. As is depicted in the right hand side of FIG. 6, the individual planes 61 are again scanned radially. In the example depicted in FIG. 6, a scanning pattern is used, having a homogenous distribution of the spokes in a circular k-space plane. As is shown in FIGS. 3 and 4, elliptical k-space planes, such as those in the right hand image of FIG. 3, may also be used with the three-dimensional scanning pattern, or, as is shown in FIG. 4, the individual partition planes can be randomly scanned, such that the spokes lie in an even distribution over the circumference. The individual neighboring partition planes of FIG. 6 are again perpendicular to the blood flow direction. Likewise, the number of spokes can be increased from the plane in FIG. 6, kz=0, to larger kz values.

In the 2D recording procedure, the excitation layer, having the changing orientation of the spokes, can constantly move, wherein the orientations can be selected for this such that the orientation of one spoke in comparison to the orientation of the preceding spoke differs by a specific angle. If the angle increment is selected such that after N spokes one returns to the starting orientation (i.e. dPhi*N=180° or 360°), then it is possible to create an evenly covered k-space through the selection of N arbitrary consecutive spokes. If in this case a somewhat smaller angle increment is selected, then a spiral shaped model is obtained—if one schematically depicts the spokes in three dimensions using the associated z coordinates.

If, however, the so-called "golden angle" value of 111.25° is selected for the angle increment, then with a selection of an arbitrary number N of spokes, a very evenly distributed configuration of these spokes in the plane is obtained, in particular if N is a number from the Fibonacci series (0, 1, 2, 3, 5, 8, 13, 21, 34, 55, 89, 144, 233, 377, . . . ). Therefore, it is possible with this pattern to retrospectively input different compromises with respect to the reconstruction results by means of a selection of more or fewer spokes. With more spokes, one avoids image artifacts, but obtains as a result, however, a less sharp mapping in the z-axis (i.e. a thicker effective layer). With fewer spokes, a reconstruction without artifacts is more difficult, but all data originate from a shorter section in the z-axis.

Overall, this non-Cartesian data acquisition can be executed with a moving bed 11. For this purpose, each image acquisition, or even each individual signal acquisition can take place at a new table position.

The MR angiographic images can also be reconstructed according to the "View-Sharing Method," wherein spokes from neighboring planes are selected in order to reconstruct an MR image.

For image reconstruction, methods for non-Cartesian parallel imaging can be made use of, such as, for example, are described in Seiberlich et al., Magn Reson Med 61, 705-715 (2009). Likewise, iterative iteration methods may be made use of, in which data from neighboring layer in 2D procedures, or partitions in 3D procedures can be used as the starting point for the current layer or partition that is to be computed. For this purpose, the idea of using temporally neighboring phases in a spatial dimension is used, because in particular with peripheral angiograms, there is usually only a slight difference from one layer to another in the head-to-foot direction.

Furthermore, it is possible to use reconstruction methods for image reconstruction from the family of Compressed-Sensing-Methods, such as are described in Lustig et al., Magn Reson Med 58, 1182-1195 (2007).

In FIG. 5, similar to in FIG. 4, different scanning patterns 50, 51, 52 are shown. The scanning patterns can be either neighboring layers of a 2D recording procedure or neighboring partitions in a 3D recording procedure. The scanning patterns 50-53 generate an elliptical field of view, wherein, similar to that in FIG. 3, an uneven distribution of the spokes is used in the scanning pattern 31, having a higher density at 3 and 9 o'clock. The distribution of the individual spokes can again be randomized, in this case however, with the additional condition that the uneven distribution is with a higher spoke density in a defined angle segment of the k-space plane.

The different possibilities described above can be combined arbitrarily. Collectively, the present invention enables the recording of numerous thin 2D layers or a complete 3D volume data set having numerous partitions in one cardiac cycle, which significantly increases the efficiency of the method.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating an angiographic image of a vascular structure in an examination region of a patient, comprising:

operating a magnetic resonance data acquisition unit comprising a radio-frequency (RF) antenna and gradient coils, in which a patient is located, by radiating, at a radiation time, at least one RF saturation pulse from said RF antenna in a volume of the patient that contains a vascular structure with blood flowing therein in a primary flow direction surrounded by surrounding tissue, said at least one RF pulse saturating nuclear spins, at said radiation time, in both said blood and said surrounding tissue, and subsequently acquiring operating said gradient coils to produce gradient fields to acquire raw magnetic resonance data from said vascular structure and said surrounding tissue from respective planar layers in said volume, each planar layer having a predetermined layer thickness and being oriented perpendicularly to said primary flow direction for generation of a magnetic resonance angiography image comprising said planar layers, and configuring said at least one RF saturation pulse to cause the nuclear spins saturated thereby to produce a lower signal intensity in said angiography image than nuclear spins, that flow in blood into the volume via at least one vessel of said vascular structure, that have not been saturated by said at least one RF pulse;

operating said gradient coils to produce said gradient fields so as to enter entering said raw magnetic resonance data representing said magnetic resonance angiography image along a radial trajectory of data entry points in a k-space memory comprising a plurality of data entry points, at which said raw magnetic data are entered, organized along respective axes defined by said gradient fields, with one of said axes corresponding to said primary flow direction, and said radial trajectory being orthogonal to said one of said axes, in order to produce an undersampled raw magnetic resonance data set in said k-space memory, said radial trajectory comprising, in each of said layers, a set of spokes comprising a plurality of spokes proceeding through a center of a matrix in said k-space memory, said magnetic resonance raw data being entered along said plurality of spokes in each of said layers with the respective sets of spokes in neighboring planar layers not coinciding when said neighboring layers are superimposed with each other; and reconstructing said magnetic resonance angiographic image from the undersampled raw magnetic resonance data set entered into said k-space memory.

2. A method as claimed in claim 1 comprising defining operating said gradient coils to produce said gradient fields so as to configure said spokes of said radial trajectory to cause a frequency of respective spokes, which define a plane in said matrix, to be unevenly distributed in said plane, thereby producing an elliptical or oval field of view perpendicular to said blood flow in the magnetic resonance angiographic image.

3. A method as claimed in claim 1 comprising, during acquisition of said raw magnetic resonance data representing said magnetic resonance angiographic image, also exposing said patient in said data acquisition unit to a pulse sequence module that suppresses a fat signal from the patient.

4. A method as claimed in claim 1 comprising operating said magnetic resonance data acquisition unit with a gradient echo sequence as said pulse sequence.

5. A method as claimed in claim 4 wherein said gradient echo sequence comprises a repetition time period between two RF excitation pulses for said gradient echo, and alternating said repetition time period between two different repetition time periods.

6. A method as claimed in claim 1 comprising reconstructing said magnetic resonance angiographic image from the raw magnetic resonance data entered into said k-space memory using an iterative reconstruction procedure in which a plurality of examination regions of the patient are respectively recorded in a temporal phase series, comprising a plurality of neighboring examination regions in said phase series, and using a reconstructed magnetic resonance angiographic image of a neighboring examination region as a starting point for said iterative reconstruction procedure.

7. A method as claimed in claim 1 comprising acquiring said raw magnetic resonance data representing said magnetic resonance angiographic image while moving said patient through said magnetic resonance data acquisition unit.

8. A method as claimed in claim 1 comprising operating said gradient coils to randomly distribute said sets of spokes in said matrix in said k-space memory.

9. A method as claimed in claim 1 comprising triggering acquisition of said magnetic resonance raw data signal by ECG monitoring.

10. A magnetic resonance apparatus for generating an angiographic image of a vascular structure in an examination region of a patient, comprising:

a magnetic resonance data acquisition unit comprising a radio-frequency (RF) antenna and gradient coils;

a control unit configured to operate said magnetic resonance data acquisition unit, in which a patient is located, by radiating, at a radiation time, at least one RF saturation pulse from said RF antenna in a volume of the patient that contains vascular structure with blood flowing therein in a flow direction surrounded by surrounding tissue, said at least one RF pulse saturating nuclear spins, at said radiation time, in both said blood and said surrounding tissue, and to subsequently operate said gradient coils to produce gradient fields to acquire raw magnetic resonance data from said vascular structure and said surrounding tissue from respective planar layers in said volume, each planar layer having a predetermined layer thickness and being oriented perpendicularly to said flow direction, for generation of a magnetic resonance angiography image comprising said planar layers, and to configure said at least one RF saturation pulse to cause the nuclear spins saturated thereby to produce a lower signal intensity in said angiography image than nuclear spins that flow in blood into the volume via at least one vessel of said vascular structure, that have not been saturated by said at least one RF pulse;

a k-space memory into which said control unit is configured to operate said gradient coils to produce said gradient fields so as to enter said raw magnetic resonance data representing said magnetic resonance angiographic image along a radial trajectory of data entry points, said k-space memory comprising respective axes defined by said gradient fields, with one of said axes corresponding to said flow direction, and said radial trajectory being orthogonal to said one of said axes, in order to produce an undersampled raw magnetic resonance data set in said k-space memory; and a processor configured to reconstruct said magnetic resonance angiographic image from the undersampled raw magnetic resonance data set entered into said k-space memory, said radial trajectory comprising, in each of said layers, a set of spokes comprising a plurality of spokes proceeding through a center of a matrix in said k-space memory, said magnetic resonance raw data being entered along said plurality of spokes in each of said layers with the respective sets of spokes in neighboring planar layers not coinciding when said neighboring layers are superimposed with each other.

* * * * *